(12) United States Patent
Pan

(10) Patent No.: US 7,701,259 B2
(45) Date of Patent: Apr. 20, 2010

(54) METHOD AND SYSTEM FOR WIDE RANGE AMPLITUDE DETECTION

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 279 days.

(21) Appl. No.: 11/690,250

(22) Filed: Mar. 23, 2007

(65) Prior Publication Data

US 2008/0136458 A1 Jun. 12, 2008

Related U.S. Application Data

(60) Provisional application No. 60/868,818, filed on Dec. 6, 2006.

(51) Int. Cl.
*H03K 5/153* (2006.01)
(52) U.S. Cl. .............................. 327/58; 327/67; 327/563
(58) Field of Classification Search ............ 327/58–60, 327/63, 65, 67, 560–563; 330/257
See application file for complete search history.

(56) References Cited

U.S. PATENT DOCUMENTS

| | | | | |
|---|---|---|---|---|
| 6,225,863 B1 * | 5/2001 | Miwa | ............................ | 330/9 |
| 6,653,900 B2 * | 11/2003 | Bu | ............................. | 330/253 |
| 6,831,502 B1 * | 12/2004 | Ooishi | ........................ | 327/541 |
| 6,977,531 B2 * | 12/2005 | Chien | ........................... | 327/62 |
| 7,042,432 B2 * | 5/2006 | Yamazaki et al. | ............. | 345/98 |
| 7,053,670 B2 * | 5/2006 | Muto et al. | .................... | 327/65 |
| 7,224,191 B1 * | 5/2007 | Wang et al. | .................... | 327/60 |

* cited by examiner

*Primary Examiner*—Quan Tra
(74) *Attorney, Agent, or Firm*—McAndrews, Held & Malloy

(57) ABSTRACT

Aspects of a method and system for wide range amplitude detection are provided. In this regard, many electronic systems may require amplitude detection of a variety of signals with widely varying amplitudes. Aspects of the invention may comprise suitable logic, circuitry, and/or code to perform amplitude detection and may be easily configured to accommodate a wide range of amplitudes. In this regard, the configuration of the amplitude detector may be performed via simple design changes and/or may be dynamically configured by suitable logic, circuitry, and/or code. Accordingly, multiplexing a single instance of the wide range amplitude detector and/or multiplexing multiple instances of the wide range amplitude detector may result in reduced design time, reduced circuit size, and/or reduced cost.

20 Claims, 4 Drawing Sheets

METHOD AND SYSTEM FOR WIDE RANGE AMPLITUDE DETECTION

CROSS-REFERENCE TO RELATED APPLICATIONS/INCORPORATION BY REFERENCE

This patent application makes reference to, claims priority to and claims benefit from U.S. Provisional Patent Application Ser. No. 60/868,818 filed on Dec. 6, 2006.

The above stated application is hereby incorporated herein by reference in its entirety.

FIELD OF THE INVENTION

Certain embodiments of the invention relate to integrated circuits. More specifically, certain embodiments of the invention relate to a method and system for wide range amplitude detection.

BACKGROUND OF THE INVENTION

The rapid technological advancements of recent years have led to a strong demand for smaller, faster, and cheaper electronics. In achieving this end, a major obstacle to overcome is the increasing complexity of testing/verifying and troubleshooting these systems. For example it may be required to gather information about a variety of signals with amplitudes that widely vary due to the multitude of circuit functions integrated into a single system. For instance, it may be required to gather amplitude information from both a relatively weak signal coming out of a mixer and a relatively strong signal coming out of an amplifier. Due to the widely varying signal amplitudes, this exemplary system would traditionally require two distinct amplitude detectors, each designed to handle a specific, narrow range of amplitudes. Accordingly, in a system where it is required to detect the amplitude of many signals, the need for many amplitude detectors may result in greatly increased design time, circuit size, and/or budget.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for wide range amplitude detection, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for wide range amplitude detection. In many electronic systems it may be necessary to detect the amplitude of a variety of signals with widely varying amplitudes. Aspects of the invention may comprise suitable logic, circuitry, and/or code that may enable signal amplitude detection and may be easily configured to accommodate a wide range of amplitudes. In this regard, the configuration of the amplitude detector may be performed via simple design changes and/or may be programmably controlled. Accordingly, multiplexing a single instance of the wide range amplitude detector and/or multiplexing multiple instances of the wide range amplitude detector may result in reduced design time, reduced circuit size, and/or reduced cost.

Figure 1:
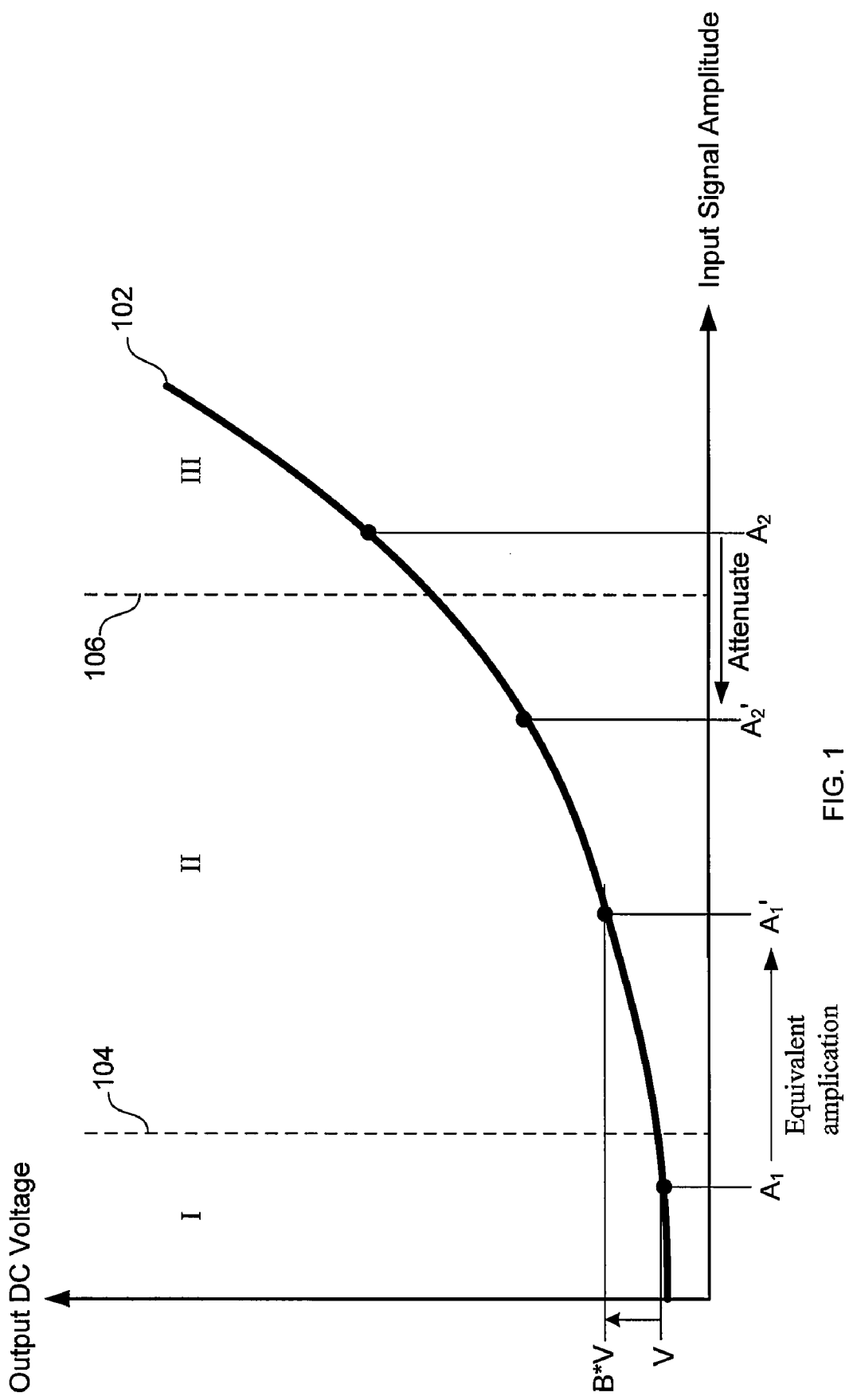
FIG. 1 is a graph illustrating an input-output characteristic of an amplitude detector, with signal amplitude as the input and output DC voltage as the output, in connection with an embodiment of the invention.

FIG. 1 is a graph illustrating an input-output characteristic of an amplitude detector, with signal amplitude as the input and output DC voltage as the output, in connection with an embodiment of the invention. Referring to FIG. 1, there is shown a y-axis corresponding to DC output voltage, an x-axis corresponding an input signal's amplitude, a curve 102, a lower threshold 104, an upper threshold 106, an input signal $A_1$, and an input signals $A_2$.

The x-axis corresponds to an input signal's amplitude. For reference, an input signal's amplitude may be referred to as being in one of three regions marked by the lower threshold 104 and the upper threshold 106. In this regard, a signal with amplitude less than the lower threshold 104 may be referred to as a region I signal, a signal with amplitude greater than the upper threshold 106 may be referred to as a region III signal, and a signal with amplitude between the lower threshold 104 and the upper threshold 106 may be referred to as a region II signal. In this manner, the lower threshold 104 may represent a signal amplitude below which an amplitude detector has insufficient accuracy and the upper threshold 106 may represent a signal amplitude outside the limited input range of an amplitude detector. In this regard, signal amplitudes above the upper threshold 106 may result in output voltages which are not defined by the input-output characteristic of the amplitude detector.

The curve 102 may represent the output DC voltage to input amplitude characteristic of an amplitude detector. The highly non-linear nature of the curve 102 illustrates why it may be difficult to use a single amplitude detector to cover a wide range of input signal amplitudes. In this regard, if the amplitude detector is designed to operate in region I, then region III amplitudes may be too large for the amplitude detector to handle and the signals may be clipped resulting in distortion and loss of accuracy. On the other hand, if the amplitude detector is designed to operate in region III, then the amplitude detector may not have sufficient resolution to distinguish one region I amplitude from another region I amplitude.

To detect the amplitude of a region I signal with sufficient accuracy, the output DC voltage may be increased by a factor, B, by introducing a feedback factor of 1/B between an output of the amplitude detector and an input of the amplitude detector. In this regard, the output DC voltage may increase by a factor B as a result of applying an equivalent amplification to the input signal. For example, applying an equivalent amplification to increase the input amplitude from $A_1$ to $A_1'$ may result in the output DC voltage increasing from V to B*V. In this manner, operation may be shifted from region I to region II and the amplitude of the input signal may be detected with sufficient accuracy. Similarly, an input signal with amplitude $A_2$ may be attenuated to have amplitude $A_2'$. In this manner, operation may be shifted from region III to region II and the amplitude of the input signal may be constrained to be below the upper threshold 106.

Figure 2A:
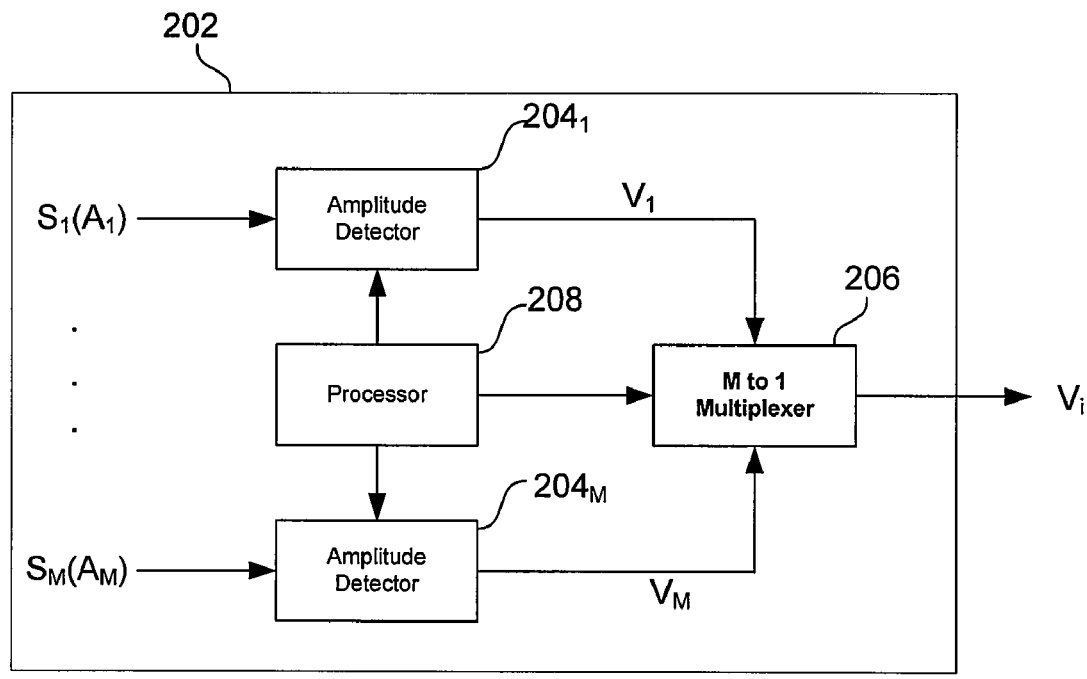
FIG. 2A is block diagram illustrating an exemplary signal processing system, which may be utilized in accordance with an embodiment of the invention

FIG. 2A is block diagram illustrating an exemplary system 202 which may be utilized in accordance with an embodiment of the invention. Referring to FIG. 2A, the system 202 may comprise one or more signals $S_1 \ldots, S_M$ with respective amplitudes $A_1 \ldots, A_M$, one or more amplitude detectors $204_1 \ldots, 204_M$, a processor 208, and a multiplexer 206.

The signals $S_1 \ldots, S_M$ may represent any type of time varying signal for which amplitude information may be desired. Exemplary signals may comprise mixer products, local oscillator signals, and power amplifier outputs.

The amplitude detectors $204_1 \ldots, 204_M$, may comprise suitable logic, circuitry, and/or code that may enable generating one or more DC voltages, $V_1 \ldots, V_M$, each corresponding, respectively, to amplitudes $A_1 \ldots, A_M$. In this manner, the relation between a signal's amplitude, $A_i$, and an output DC signal, $V_i$, may be related by the curve 102, as described in FIG. 1, corresponding to the amplitude detector $204_i$. In one embodiment of the invention, the input-output characteristic of the amplitude detector $204_i$ may be programmably controlled.

The multiplexer 206 may comprise suitable logic, circuitry, and/or code that may enable selecting one DC voltage, $V_i$, from the multitude of DC voltages, $V_1 \ldots, V_M$, and may enable passing the selected DC voltage, $V_i$, to an output.

The processor 208 may comprise suitable logic, circuitry, and/or code that may enable outputting one or more control signals to the amplitude detectors $204_1 \ldots 204_M$, and to the multiplexer 206. In one embodiment of the invention, the processor 208 may enable generation of one or more signals to programmably control the input-output characteristic of the amplitude detector $204_i$.

In operation, one or more signals, $S_1 \ldots, S_M$, with respective amplitudes $A_1 \ldots A_M$, may be respectively applied to the amplitude detectors $204_1 \ldots, 204_M$. Depending on the amplitudes, $A_1 \ldots A_M$, each of the amplitude detectors $204_1 \ldots, 204_M$ may respectively attenuate or apply an equivalent amplification to the signal applied to it. The amount of attenuation or equivalent amplification applied to each of signals $S_1 \ldots, S_M$ may be determined by one or more control signals coming from the processor 208. In this manner, each of the amplitude detectors $204_1 \ldots 204_M$ may operate on signals in any of the regions I, II, and III described in FIG. 1. In this manner, the DC voltage output of each of the amplitude detectors $204_1 \ldots, 204_M$ may be determined by a separate and/or distinct curve such as the curve 102. The DC voltages, $V_1 \ldots, V_M$, output by the amplitude detectors may be applied to multiplexer 206, which may select $V_i$ to pass to its output. The selected voltage, $V_i$, may be determined by one or more control signals from processor 208 to the multiplexer 206.

Figure 2B:
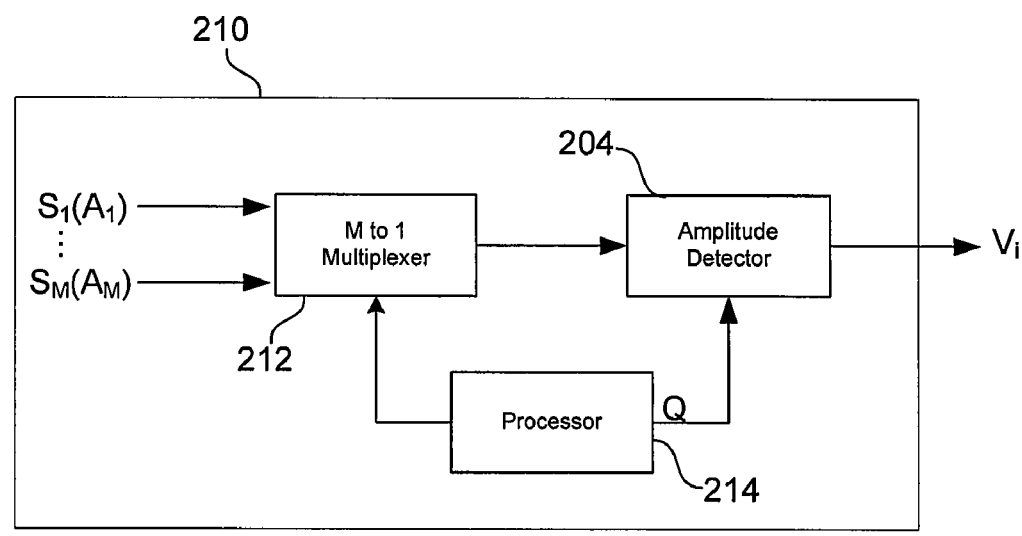
FIG. 2B is block diagram illustrating an exemplary signal processing system, which may be utilized in accordance with an embodiment of the invention

FIG. 2B is block diagram illustrating an exemplary system 210 which may be utilized in accordance with an embodiment of the invention. Referring to FIG. 2A, the system 210 may comprise one or more signals, $S_1 \ldots, S_M$, with respective amplitudes $A_1 \ldots, A_M$, an amplitude detector 204 a multiplexer 212, and a processor 214.

The signals $S_1 \ldots, S_M$ may represent any type of time varying signal for which amplitude information is desired; exemplary signals being mixer products, local oscillator signals, and power amplifier outputs.

The amplitude detector 204, may comprise suitable logic, circuitry, and/or code that may enable generating one or more DC voltage, $V_1 \ldots, V_M$, each corresponding respectively to the amplitudes $A_1 \ldots, A_M$. In this manner, the signal amplitude $A_i$ and the output DC signal $V_i$, may be related by the curve 102 described in FIG. 1, corresponding to the amplitude detector $204_i$. In one embodiment of the invention, the input-output characteristic of the amplitude detector $204_i$ may be programmably controlled.

The multiplexer 212 may comprise suitable logic, circuitry, and/or code that may enable selecting one signal, $S_i(A_i)$, from the plurality of input signals, $S_1(A_1) \ldots, S_M(A_M)$, and may enable passing the selected DC voltage, $S_i$, to the amplitude detector 204.

The processor 214 may comprise suitable logic, circuitry, and/or code that may enable outputting one or more control signals to the amplitude detector 204, and to the multiplexer 212. In one embodiment of the invention, the processor 214 may provide one or more signals to the amplitude detector to programmably control the input-output characteristic of the amplitude detector 204.

In operation, a signal $S_i$, with amplitude $A_i$, may be selected and passed by the multiplexer 212 to an amplitude detector 204. Depending on the amplitude, $A_i$, the amplitude detector 204 may attenuate or apply an equivalent amplification to the signal $S_i$. The amount of attenuation or equivalent amplification applied to $S_i$ may be determined by one or more control signals coming from the processor 214. In this manner, the amplitude detector 204 may operate on signals in any of the regions I, II, and III described in FIG. 1. The DC voltage output by amplitude detector 204 is thus determined by the input-output voltage characteristic of the amplitude detector, such as the curve 102 described in FIG. 1.

Figure 3:
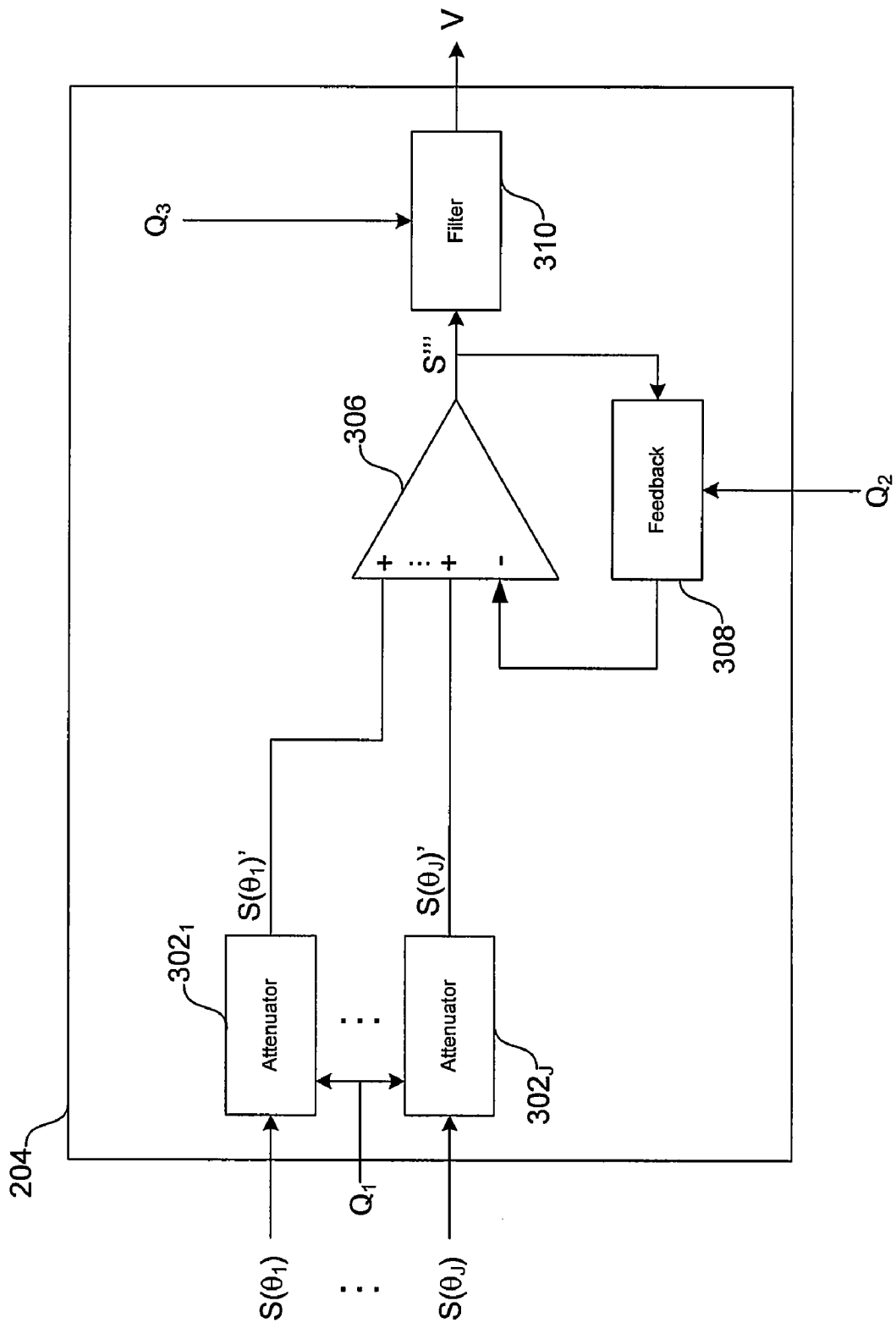
FIG. 3 is a block diagram illustrating an exemplary wide range amplitude detector, in accordance with an embodiment of the invention.

FIG. 3 is a block diagram illustrating a wide range amplitude detector in accordance with an embodiment of the invention. Referring to FIG. 3, the amplitude detector 204 may detect the amplitude of a signal S comprising a number of phases, J. The amplitude detector 204 may comprise a plurality of attenuators 302, a multiple input single ended output amplifier 306, a feedback block 308, and a filter 310.

The attenuators 302 may comprise suitable logic, circuitry, and/or code that may enable an attenuation of each phase of an input signal, S. The attenuation provided by attenuator 302 may be fixed or may variable and may be programmably controlled one or more control signals, Q1, which may be provided by a processor such as the processors 208 and 214 in FIG. 2. Various embodiments of the invention, may utilize a number of attenuators equal to the number of phases, J, of the input signal.

The differential input single ended output amplifier 306 may comprise suitable logic, circuitry, and/or code that may enable a rectification and an amplification of the signal S'. In one embodiment of the invention, the amplifier 306 may comprise a number, K, of positive inputs, a negative input and a single ended output. The number, K, of positive inputs may correspond to the number, J, of phases of the signal S'. For a single ended signal (J=1), K is equal to J+1 (K=2) and the differential input single ended output amplifier 306 comprises a differential positive input. In this manner, the single phase signal may be communicatively coupled to a first positive input of the differential input single ended output amplifier 306 and a bias voltage may be communicatively coupled to a second positive input of the differential input single ended output amplifier 306. For a multi-phase signal S', the number of positive inputs, K, may be equal to the number of phases, J, of the signal S', and the differential input single ended output amplifier 306 may comprise two or more positive inputs. In this manner, each phase of the signal S' may be communicatively coupled to a corresponding positive input of the amplifier 306. In this regard, rectification of the input signal may be achieved as all changes in an amplitude of S' may result in a positive swing at the single ended output of the amplifier.

The amount of equivalent amplification of the amplitude detector 204 may be determined by a negative feedback. In this regard, the single ended output of the amplifier may be communicatively coupled to the negative input of the amplifier via the feedback network 308. Additionally, the amplifier 306 may comprise various topologies of varying complexities including single stage and multi-stage topologies.

The feedback block 308 may comprise suitable logic, circuitry, and/or code that may enable controlling the amount of equivalent amplification of the amplitude detector 204 by communicatively coupling the single ended output of the amplifier 306 to the negative input of the amplifier 306. In one embodiment of the invention, the feedback block 308 may comprise a voltage divider. In this regard, exemplary feedback networks may comprise voltage dividers comprising fixed-impedance components, variable-impedance components, or banks of components communicatively coupled in parallel via switches. In other various embodiments of the invention, the feedback block 308 may comprise active components. The feedback block 308 may be programmably controlled by one or more signals Q2, which may be provided by a processor such as the processors 208 and 214 in FIG. 2.

The filter 310 may comprise suitable logic, circuitry, and/or code that may enable filtering a signal S'''. In one embodiment of the invention, the filter 310 may comprise active circuits, fixed-impedance passive components and/or variable-impedance passive components. Furthermore, components of the filter 310 may be communicatively coupled in via switches.

In operation, amplitude detection may be required for a signal S. Depending on the range of amplitudes that S may display, the attenuator 302 may attenuate or pass the signal S to generate the signal S'. In this regard, the attenuation of the signal may be pre-determined by one or more values of the components comprising the attenuator 302, or the attenuation may be programmably determined by one or more control signals, $Q_1$, from a processor such as the processors 208 and 214 described in FIG. 1A. Next, the signal S' output by the attenuator 302 may be rectified and amplified by amplifier 306, resulting in the signal S'''. In this regard, communicatively coupling each phase of S' to a respective positive input of the amplifier may result in a rectified signal at the output of the amplifier. Additionally, the amount of equivalent amplification of amplitude detector 204 may be determined by the feedback network 308, which may be programmably controlled by one or more signals from a processor. The signal S''' may be filtered by the filter 310 and the filter output, V, may be a DC voltage corresponding to the signal S via the input-output voltage characteristic, such as curve 102 described in FIG. 1, of the amplitude detector 204.

Figure 4:
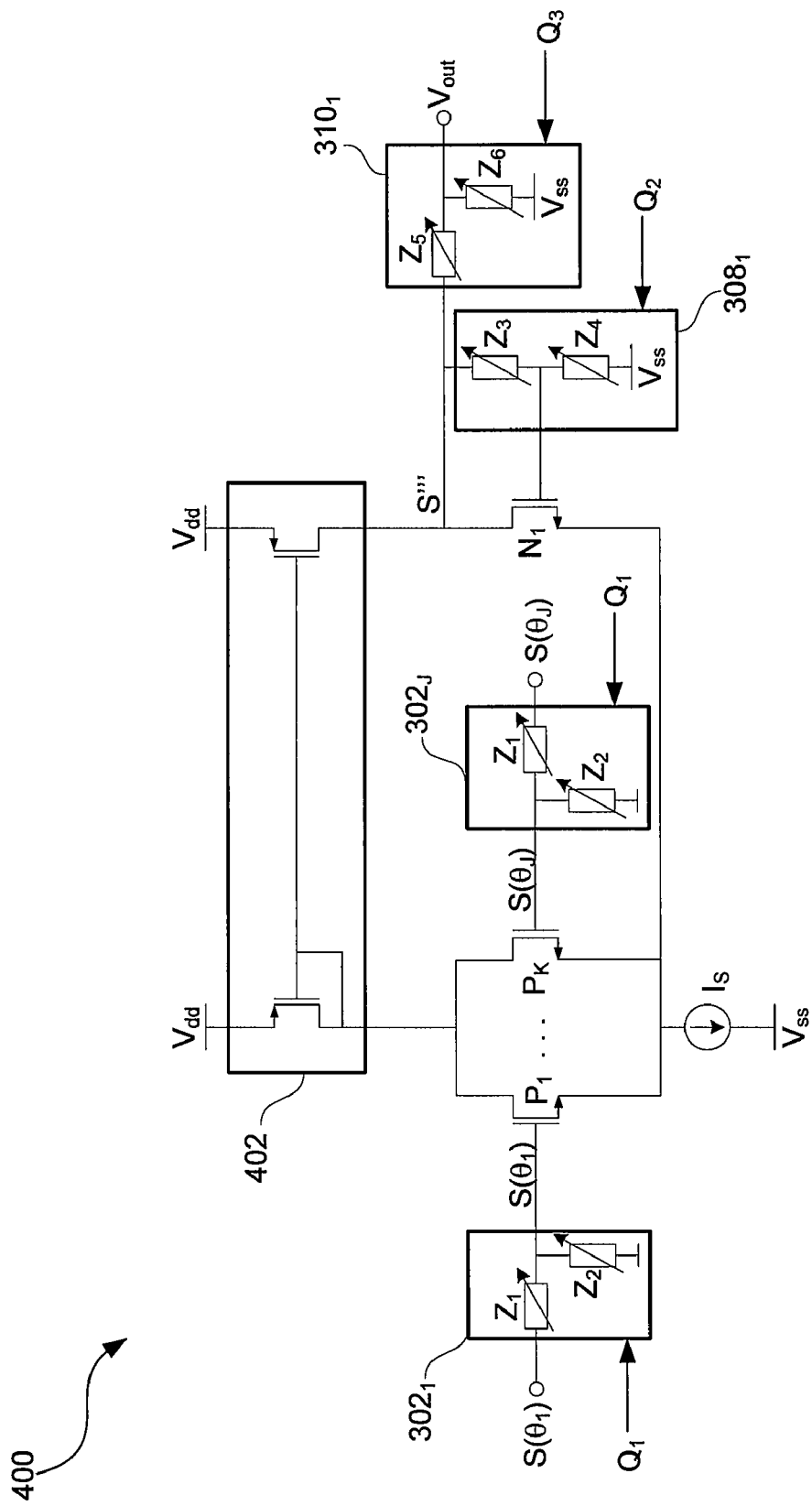
FIG. 4 is a circuit diagram illustrating an exemplary wide range amplitude detector in accordance with an embodiment of the invention.

FIG. 4 is a circuit diagram illustrating a wide range amplitude detector in accordance with an embodiment of the invention. Referring to FIG. 4 a circuit implementation is shown for the amplitude detector 204 that may be utilized to detect the amplitude of a "J" phase signal. In this regard, the circuit may comprise a number "J" of attenuator circuits $302_1 \ldots, 302_J$, a feedback circuit $308_1$, a filter circuit $310_1$, two or more positive input transistors $P_1 \ldots, P_K$, a negative input transistor $N_1$, and a current mirror $312_1$, wherein each of the transistors may comprise a gate, a source, and a drain.

The attenuator circuits $302_1 \ldots, 302_J$ may each represent an embodiment of the attenuator block 302 described in FIG. 3. Each of the attenuator circuits $302_1 \ldots 302_J$ may comprise an impedance $Z_1$ and an impedance $Z_2$ communicatively coupled forming a voltage divider circuit. In this regard, exemplary attenuator circuits may comprise voltage dividers comprising fixed-impedance components, variable-impedance components, and/or banks of components communicatively coupled in parallel via switches. In various other embodiments of the invention the attenuator circuits $302_1 \ldots, 302_J$ may comprise active components.

The feedback circuit $308_1$ may represent an embodiment of the feedback block 308 described in FIG. 3. The feedback circuit $308_1$ may comprise an impedance $Z_3$ and an impedance $Z_4$ communicatively coupled forming a voltage divider circuit. In this regard, exemplary feedback circuits may comprise voltage dividers comprising fixed-impedance components, variable-impedance components, and/or banks of components communicatively coupled in parallel via switches. In other embodiments of the invention the feedback circuit $308_1$ may comprise active components.

The filter circuit $310_1$ may comprise an embodiment of the filter block 310 described in FIG. 3. The filter circuit $310_1$ may comprise an impedance $Z_5$ and an impedance $Z_6$ communicatively coupled to form a low pass filter. In this regard, exemplary feedback circuits may comprise low pass filters comprised of fixed-impedance components, variable-impedance components, and/or banks of components communicatively coupled in parallel via switches. In other embodiments of the invention the feedback circuit 408 may comprise active components.

The positive input transistors $P_1 \ldots, P_K$, the negative input transistor $N_1$, and the current mirror 402 may be communicatively coupled as shown in FIG. 4 to form a differential input single ended output amplifier such as the amplifier 306 described in FIG. 3. In this regard, the positive input of the amplifier 306 may comprise the transistors, $P_1 \ldots, P_K$ and the negative input of the amplifier 306 may comprise the transistor $N_1$.

In operation, an input signal may be communicatively coupled to the gate of one of the positive input transistors $P_1 \ldots, P_K$. As the signal varies, the gate of the positive input transistor that is communicatively coupled to a higher voltage, at any given time, will conduct, and the signal will be amplified with a corresponding positive swing at the output of the amplifier. The output signal S''' is thus a rectified and amplified version of the input signal. In this regard, a multi-phase input signal with J phases may be amplified and rectified by applying each of the phases to the gate of one of the positive input transistors $P_1 \ldots, P_K$. Furthermore, a single-phase (single-ended) input signal may be amplified and rectified utilizing two transistors $P_1$ and $P_2$ by communicatively coupling the signal to the gate of the transistor $P_1$ and biasing the gate of the transistor $P_2$ at a common mode input voltage. Additionally, negative feedback to control the gain of amplifier 306 may be applied to the negative input of the amplifier 306 by communicatively coupling the feedback circuit 308, between the gate of the transistor $N_1$ and the drain of the transistor $N_1$. In this manner, amplifier 306 may provide an equivalent amplification of the input signal. The filter circuit may $310_1$ may filter S''' to output a DC voltage.

Aspects of the invention may be found in a method and system for detecting the amplitude of an input signal utilizing a differential input single ended output amplifier 306, and generating a DC voltage representative of the detected amplitude. In this regard, the output of the amplifier 306 may be filtered, as shown in FIG. 3, to obtain the DC output voltage.

In various embodiments of the invention, the input signal may comprise one or more phases. For a single phase input signal, the differential input single ended output amplifier 306 may be enabled detect the amplitude of the signal by communicatively coupling the single phase input signal to a first positive input of the differential input single ended output amplifier and communicatively coupling a bias voltage to a second positive input of the differential input single ended output amplifier 306. For a multiphase input signal, the differential input single ended output amplifier 306 may detect the amplitude of the signal by communicatively coupling each of the phases of the multiphase input signal to a corresponding positive input of the differential input single ended output.

In various embodiments of the invention, the gain of the differential input single ended output amplifier 306 may be controlled via negative feedback, such as the negative feedback network 308 shown in FIG. 3. In this regard, the amplifier 306 may provide an equivalent amplification of the input signal, and the amplification may be variable and may be programmably controlled by one or more signals from a processor such as the processors 308 and 314 in FIG. 2. Additionally, the input signal may be attenuated, as shown by attenuators 302 in FIG. 3, prior to being coupled to the differential input single ended output amplifier 306. In this regard, the attenuation of the input signal may be variable and may be programmably controlled by a processor such as the processors 308 and 314 in FIG. 2.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals, the method comprising selecting one of a plurality of signals for processing by an amplitude detector, wherein said amplitude detector comprises a multiple-input-single-ended-output amplifier, a configurable feedback circuit, and a plurality of configurable attenuator circuits coupled, respectively, to a plurality of positive inputs of said multiple-input-single-ended-output amplifier;

configuring said feedback circuit and said plurality of attenuator circuits based on which one of said plurality of signals is selected;

and generating from an output of said multiple-input-single-ended-output amplifier, a DC voltage representative of an amplitude of said selected signal.

2. The method according to claim 1, comprising filtering said generated output of said multiple-input-single-ended-output amplifier.

3. The method according to claim 1, comprising attenuating said selected one of said plurality of signals.

4. The method according to claim 3, comprising varying said attenuation of said selected one of said plurality of signals based on which one of said plurality of signals is selected.

5. The method according to claim 4, comprising programmably controlling said variation of said attenuation of said selected one of said plurality of signals.

6. The method according to claim 1, comprising varying a gain of said feedback circuit.

7. The method according to claim 6, comprising programmably controlling said variation of said gain of said feedback circuit.

8. The method according to claim 1, comprising coupling each of a plurality of phases of said selected one of said plurality of signals to a corresponding one of said plurality of positive inputs.

9. The method according to claim 1, comprising, in instances that said selected one of said plurality of signals comprises a single phase, coupling a bias voltage to a first one of said plurality of inputs and coupling said selected one of said plurality of signals to a second one of said plurality of positive inputs.

10. The method according to claim 1, comprising controlling an equivalent amplification of said amplitude detector utilizing said feedback circuit.

11. A system for processing a signal, the system comprising:

one or more circuits comprising an amplitude detector that comprises a multiple-input-single-ended-output amplifier, a configurable feedback circuit, and a plurality of configurable attenuator circuits coupled, respectively, to a plurality of positive inputs of said multiple-input-single-ended-output amplifier, wherein said one or more circuits are operable to:

select one of a plurality of signals for processing by said amplitude detector;

configure said feedback circuit and said plurality of attenuator circuits based on which one of said plurality of signals is selected; and generate from an output of said multiple-input-single-ended-output amplifier, a DC voltage representative of an amplitude of said selected signal.

12. The system according to claim 11, wherein said one or more circuits are operable to filter said generated output of said multiple-input-single-ended-output amplifier.

13. The system according to claim 11, wherein said one or more circuits are operable to attenuate said selected one of said plurality of signals.

14. The system according to claim 13, wherein said one or more circuits are operable to vary said attenuation of said selected one of said plurality of signals based on which one of said plurality of signals is selected.

15. The system according to claim 14, wherein said one or more circuits are operable to programmably control said variation of said attenuation of said selected one of said plurality of signals.

16. The system according to 11, wherein said one or more circuits are operable to vary a gain of said feedback circuit.

17. The system according to 16, wherein said one or more circuits are operable to programmably control said variation of said gain of said feedback circuit.

18. The system according to claim 11, wherein said one or more circuits is operable to couple each of a plurality of phases of said selected one of said plurality of signals to a corresponding one of said plurality of positive inputs.

19. The system according to claim 11, wherein said one or more circuits are operable to, in instances that said selected one of said plurality of signals comprises a single phase, couple a bias voltage to a first one of said plurality of inputs and couple said selected one of said plurality of signals to a second one of said plurality of positive inputs.

20. The system according to claim 11, wherein said one or more circuits enables controlling an equivalent amplification of said amplitude detector utilizing said feedback circuit.

* * * * *